(12) United States Patent
Khoueir et al.

(10) Patent No.: US 7,847,278 B2
(45) Date of Patent: Dec. 7, 2010

(54) PLANAR PROGRAMMABLE METALLIZATION MEMORY CELLS

(75) Inventors: Antoine Khoueir, Apple Valley, MN (US); Haiwen Xi, Prior Lake, MN (US); Shuiyuan Huang, Apple Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 232 days.

(21) Appl. No.: 12/233,770

(22) Filed: Sep. 19, 2008

(65) Prior Publication Data

US 2010/0072448 A1   Mar. 25, 2010

(51) Int. Cl.
*H01L 47/00* (2006.01)
(52) U.S. Cl. .......................................................... 257/4
(58) Field of Classification Search .................... 257/4; 438/102, 103
See application file for complete search history.

(56) References Cited

U.S. PATENT DOCUMENTS

| | | | |
|---|---|---|---|
| 6,348,365 B1 | 2/2002 | Moore et al. | |
| 6,867,114 B2 | 3/2005 | Moore et al. | |
| 7,056,762 B2 | 6/2006 | Moore et al. | |
| 2006/0284214 A1* | 12/2006 | Chen | 257/213 |
| 2007/0064352 A1 | 3/2007 | Gill | |
| 2007/0138458 A1* | 6/2007 | Lung | 257/4 |
| 2008/0001137 A1 | 1/2008 | Kozicki et al. | |
| 2008/0006812 A1 | 1/2008 | Kozicki et al. | |
| 2008/0277642 A1* | 11/2008 | In T Zandt et al. | 257/4 |

OTHER PUBLICATIONS

Chen et al., Ultra-Thin Phase-Change Bridge Memory Device Using GeSb, 2006 IEEE.
Kozicki et al., Nanoscale Memory Elements Based on Solid-State Electrolytes, IEEE Transactions on Nanotechnology, vol. 4, No. 3, May 2005.

* cited by examiner

*Primary Examiner*—Bradley K Smith
(74) *Attorney, Agent, or Firm*—Campbell Nelson Whipps LLC

(57) ABSTRACT

Programmable metallization memory cells that have an inert electrode and an active electrode positioned in a non-overlapping manner in relation to a substrate. A fast ion conductor material is in electrical contact with and extends from the inert electrode to the active electrode, the fast ion conductor including superionic clusters extending from the inert electrode to the active electrode. A metal layer extends from the inert electrode to the active electrode, yet is electrically insulated from each of the inert electrode and the active electrode by the fast ion conductor material. Methods for forming programmable metallization cells are also disclosed.

14 Claims, 5 Drawing Sheets

PLANAR PROGRAMMABLE METALLIZATION MEMORY CELLS

BACKGROUND

Memory devices are common in electronic systems and computers to store data. These memory devices may be volatile memory, where the stored data is lost if the power source is disconnected or removed, or non-volatile, where the stored data is retained even during power interruption. An example of a non-volatile memory device is the programmable conductor random access memory that utilizes a programmable metallization cell (PMC).

A PMC utilizes a fast ionic conductor or a solid ionic electrolyte, such as a chalcogenide or oxide material, that may be embedded with a superionic phase. The PMC is oriented vertically on a substrate, as a tower or column. The fast ion conductor material or electrolyte is present between two electrodes of different reduction/oxidation potential, one electrode being an active electrode and the other an inert electrode, often composed of a noble metal. A metal layer, often silver, is positioned next to the active electrode. Superionic clusters are formed in the fast ion conductor material by dissolution of ions from the metal layer into the fast ionic conductor material by exposure to UV light radiation. When a bipolar voltage is applied between the two electrodes, an electrical pathway grows or dissolves within the superionic clusters, to change the resistance of the cell. The fast ion conductor and superionic clusters are important elements of the PMC. Construction and configuration of the superionic clusters is important for providing effective and reliable programming of the PMC.

Since the metal layer is positioned on one side of the memory cell, proximate the active electrode, the diffusion of the metal ions is not uniform from the top to the bottom of the PMC. This affects the superionic cluster formation and causes cell-to-cell variation as well.

The structures of the present invention have better structural uniformity than previous PMCs and provide more consistent operation than previous PMCs, as will become apparent to those skilled in the art from the following disclosure.

BRIEF SUMMARY

This present disclosure is to programmable conductor dynamic random access memories utilizing a programmable metallization cell. The present disclosure is to programmable metallization cells and memory arrays including those cells. The cells include superionic clusters extending between an active electrode and an inert electrode, with the two electrodes being positioned on a substrate, often in a generally planar orientation. Methods for forming programmable metallization cells are also disclosed.

In one particular embodiment, this disclosure is to a programmable metallization memory cell that has an inert electrode and an active electrode, the electrodes positioned in a non-overlapping manner in relation to a substrate. A fast ion conductor material is in electrical contact with and extends from the inert electrode to the active electrode, the fast ion conductor including superionic clusters extending from the inert electrode to the active electrode. A metal layer extends from the inert electrode to the active electrode, yet is electrically insulated from each of the inert electrode and the active electrode by the fast ion conductor material.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
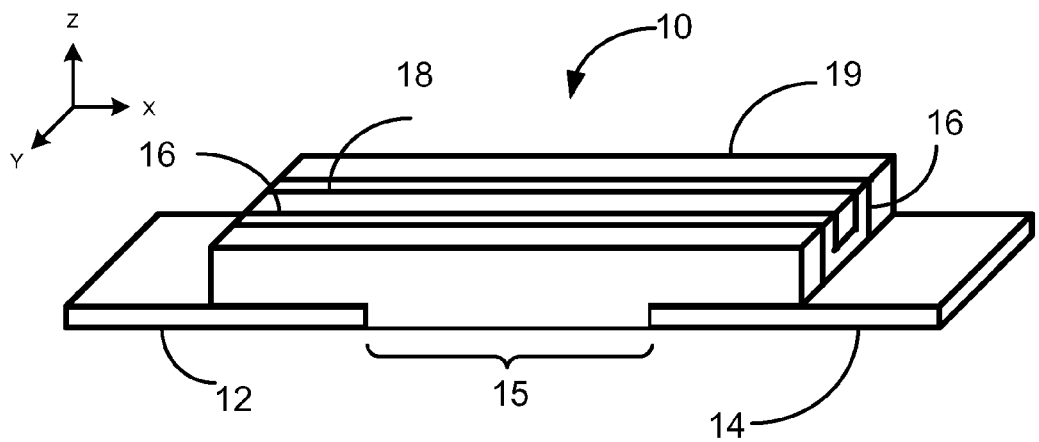
FIG. 1 is a schematic perspective view of a first embodiment of a programmable metallization memory cell according to the present disclosure.

The present disclosure is to programmable metallization memory cells and memory arrays including those cells. Programmable metallization cell (PMC) memory is based on the physical re-location of superionic regions within a solid electrolyte material. A PMC memory cell includes two solid metal electrodes, one relatively inert the other electrochemically active, with this fast ion conductor, i.e., the electrolyte material with superionic regions, between them. When a negative bias is applied to the inert electrode, metal ions in the fast ion conductor, as well as some originating from the now-positive active electrode, flow and are reduced by the inert electrode. After a short period of time the flowing ions form linked clusters of the superionic regions extending between the two electrodes. The clusters dramatically reduce the resistance between the electrodes, which can be measured to indicate that the "writing" process is complete.

Reading the PMC simply requires a small voltage applied across the cell. If the linked superionic clusters are present in that cell, the resistance will be low, leading to higher current, which can be read as a "1". If there are no linked superionic clusters present or the linkage of the superionic clusters is broken, the resistance is higher, leading to low current, which can be read as a "0".

Erasing the cell is similar to writing, but uses a positive bias on the inert electrode. The metal ions will migrate away from the superionic clusters, back into the fast ion conductor material, and eventually to the negatively-charged active electrode. This breaks the linkage of the superionic clusters and increases the resistance of the fast ion conductor.

The present disclosure is to programmable metallization memory cells and memory arrays including those cells. The electrodes in the memory cells of this invention are non-overlapping, in relation to a substrate, essentially co-planar with each other. In some embodiments, the electrodes are directly on the substrate, whereas in other embodiments intervening layer(s) are present between the substrate and the electrodes. A metal layer, used to provide ions to the fast ion conductor material to form the superionic clusters, extends between the electrodes in a non-electrically conducting manner. The metal layer is insulated from direct contact with the electrodes. The resulting channel or path of superionic clusters is more uniform from one electrode to the other than that in the conventional, vertical memory cell structures. In addition, the channel or path of superionic clusters can be readily controlled by the thickness and the width of the metal layer and fast ion conductor material layer. The benefits brought by the non-overlapping electrode structures include increased memory density, variability, and reliability.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

It should be understood that when two elements are "proximate" to each other, as used in this disclosure, means that the two elements are adjacent, close to or near to each other, and that it does not preclude having intervening layers therebetween. Similarly, when a first element is "on" a second element, as used in this disclosure, means that the first element is supported by the second element, and that it does not preclude having intervening layers therebetween.

Figure 1A:
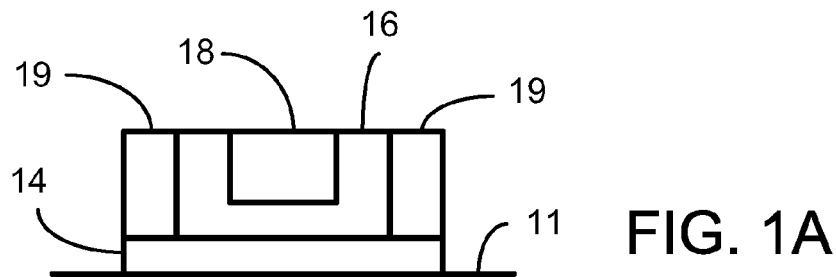
FIG. 1A is an end view of the memory cell of FIG. 1.

A first embodiment of a programmable metallization memory cell according to this disclosure is illustrated in FIG. 1 and FIG. 1A as memory cell 10. Memory cell 10 has a substrate 11 with a first electrode 12 and a second electrode 14 positioned on substrate 11. Electrodes 12, 14 are co-planar, positioned on substrate 11 in a non-overlapping manner, in that no portion of one electrode (for example, electrode 12) is positioned between substrate 11 and the other electrode (for example, electrode 14). In some embodiments, electrodes 12, 14 may be non-planar, but in a non-overlapping manner.

Electrodes 12, 14 are formed of an electrically conducting material, for example, metal. First electrode 12 is an active electrode, made of for example, silver (Ag), copper (Cu), tantalum (Ta) or titanium (Ti). Second electrode 14 is an inert electrode, made of, for example, tungsten (W) or a noble metal such as gold (Au), platinum (Pt), palladium (Pd) and rhodium (Rh). Typically, the material of electrode 12 is different from that of electrode 14. Electrodes 12, 14 form the electrical connection with word lines and bit lines when memory cell 10 is operably configured in a memory array.

Electrodes 12, 14 typically have a size (surface area) of about 5-2500 nm$^2$, with a thickness of about 2-50 nm, although larger and smaller electrodes could be used. Electrodes 12, 14 are non-overlapping and spaced from each other on substrate 11 in the X-direction by a gap 15. This gap is usually about 1 micrometer to about 10 micrometers, although larger and smaller gaps are within the scope of this invention. Extending in the Z-direction, no portion of electrode 12 is positioned between substrate 11 and electrode 14, and no portion of electrode 14 is positioned between substrate 11 and electrode 12.

In electrical contact with, and extending from electrode 12 to electrode 14 is a fast ion conductor material 16. The layer of fast ion conductor material 16 often has a thickness of about 2-50 nm, although thinner and thicker layers could be used. Fast ion conductor material 16 may be a base glass material, such as a germanium selenide (GeSe) material. In some embodiments, germanium selenide materials are referred to as chalcogenide glass or chalcogenide materials. Specific examples of suitable fast ion conductor material 16 include $Ge_3Se_7$, $Ge_4Se_6$, and $Ge_2Se_3$, although numerous germanium selenide materials are known and can be used. Other chalcogenide or base glass materials, which form superionic clusters when infused with metal ions, could alternately be used.

Positioned proximate fast ion conductor material 16 is a thin metal layer 18, selected based on its ion diffusivity. In many embodiments, metal layer 18 is electrochemically active, made of an oxidizable material, for example, silver (Ag), copper (Cu), tantalum (Ta), titanium (Ti), etc. Metal layer 18 extends from first electrode 12 to second electrode 14, electrically insulated from electrodes 12, 14 by fast ion conductor material 16. Metal layer 18 often has a thickness of about 2-50 nm.

Fast ion conductor material 16 includes regions or clusters of superionic material that facilitate the transfer of electrons between electrode 12 and electrode 14. Superionic clusters 17 (see FIG. 2) form when metal ions from fast ion conductor material 16 and from metal layer 18 flow toward second electrode 14. This flow of metal ions is usually initiated and/or facilitated by irradiating metal layer 18 with UV light with optional heating. As an example, if chalcogenide glass $Ge_3Se_7$ is the fast ion conductor material 16, and thin metal layer 18 is silver (Ag), irradiating metal layer 18 with UV light will cause Ag+ ions to flow into fast ion conductor material 16 and form superionic clusters 17 comprising chalcogenide-metal ion material, $AgGe_3Se_7$. Voltage applied on electrodes 12, 14 in write operations will break connection between superionic clusters 17 or re-establish the connection and change the memory cell between two resistance states.

Figure 2:
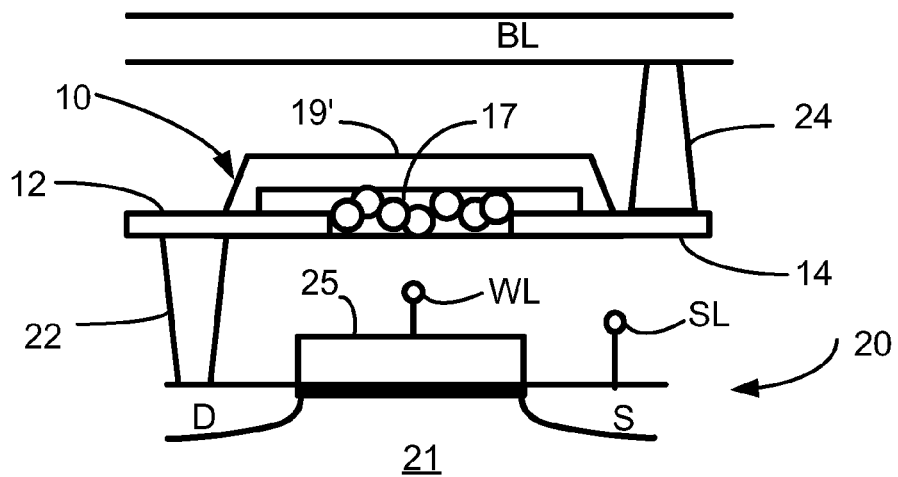
FIG. 2 is a schematic cross-section side view diagram of the memory cell of FIG. 1 operably connected to a control transistor and bit line.

Not illustrated in FIG. 1 or 1A in memory cell 10, but shown in FIG. 2, a dielectric material cover 19' is present over the structure and insulates fast ion conductor 16 and metal layer 18.

FIG. 2 illustrates memory cell 10 electrically connected to a control transistor 20 at electrode 12 and to a bit line BL at electrode 14. In alternate embodiments, electrode 14 is electrically connected to the control transistor and electrode 12 is connected to the bit line. Control transistor 20 and variations thereof are well known. Simplified, transistor 20 includes an insulative substrate 21 having a source region S and a drain region D and a gate 25 therebetween. Electrically connected to source region S is a source line SL and electrically connected to gate 25 is a word line WL. Both source line SL and word line WL may extend orthogonal to bit line BL. Memory cell 10 is connected to control transistor 20 by a plug 22 extending from electrode 12. Memory cell 10 is also connected to bit line BL by a plug 24 extending from electrode 14. Alternately, plug 22 may extend from electrode 14 and plug 24 may extend from electrode 12. Transistor 20 and the other elements of FIG. 2 and their connection to memory cell 10 can be formed using conventional semiconductor fabrication techniques. Additional layers or elements may be present between memory cell 10 and bit line BL or drain region D.

Figure 3A:
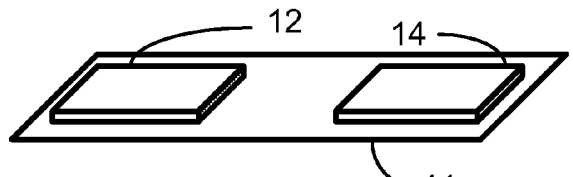
FIGS. 3A-3H are schematic side views of steps for forming the memory cell of FIG. 1.

Turning to FIGS. 3A through 3G, one method for manufacturing memory cell 10 is illustrated stepwise. Although this is a suggested process or method to form memory cell 10, any of these steps may be excluded, replaced with alternate steps, or additional steps may be done. In FIG. 3A, a first conductive material is applied to substrate 11, for example, by sputtering, physical vapor deposition, photolithography or other thin film processing techniques to form electrode 12. To obtain the desired shape, a mask or other patterning material can be applied to substrate 11 and then removed after application of the first conductive material. A second conductive material is applied to substrate 11, for example, by sputtering, physical vapor deposition, photolithography or other thin film processing techniques to form electrode 14. To obtain the desired shape, a mask or other patterning material can be applied to substrate 11 and then removed after application of the second conductive material. The application of the conductive materials for electrodes 12, 14 may be done simultaneously, but is usually done sequentially, with no particular preference of order.

Figure 3B:
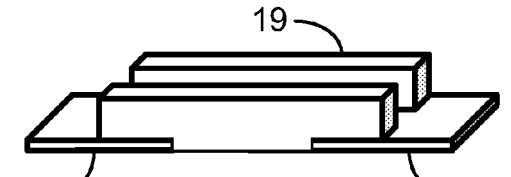

In FIG. 3B, two strips of dielectric material are deposited and patterned over electrodes 12, 14 and between them as dielectric strips 19.

Figure 3C:
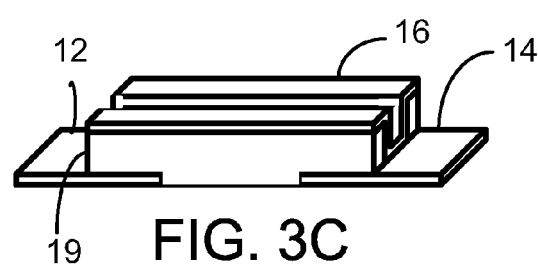
Figure 3D:
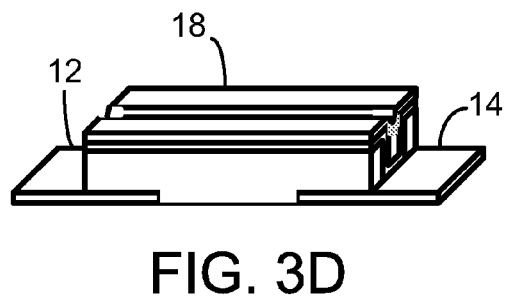

Fast ion conductor material 16 is deposited over electrodes 12, 14 and dielectric strips 19 in FIG. 3C to fill in the spacing between dielectric strips 19. Fast ion conductor material 16 physical contacts and extends between electrodes 12, 14. Next, in FIG. 3D, metal layer 18 is deposited on fast ion conductor material 16 extending from electrode 12 to electrode 14, and in this embodiment, the entire length of fast ion conductor material 16. The amount and thickness of the fast ion conductor material and the metal layer should be well controlled for superionic cluster formation in the next step.

Figure 3E:
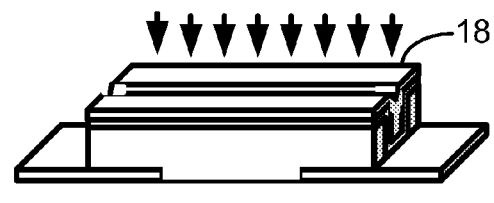

In FIG. 3E, the structure is exposed to UV light radiation or heat treatment to diffuse metal ions from metal layer 18 into the fast ion conductor material to form superionic clusters. The structure with superionic clusters may optionally be precisely formed to the desired shape and size, by patterning and etching the stacked dielectric 19, fast ion conductor 16 and metal layer 18.

Figure 3F:
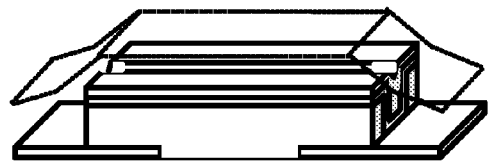
Figure 3G:
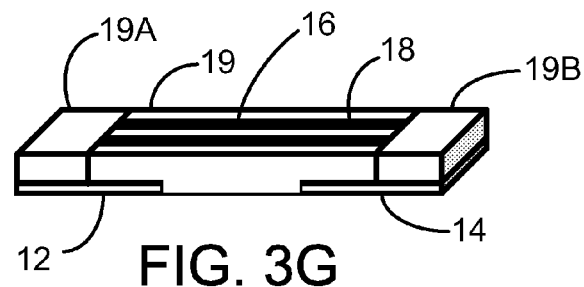

After this, as illustrated in FIG. 3F, the structure can be masked and additional dielectric material deposited over unmasked portions of the structure to cover (e.g., insulate) exposed areas of electrodes 12, 14. Alternately, dielectric material can be deposited over the entire structure, and subsequently any undesired dielectric material over fast ion conductor 16 and metal layer 18 can be removed (for example, by planarization, milling, polishing).

Figure 3H:
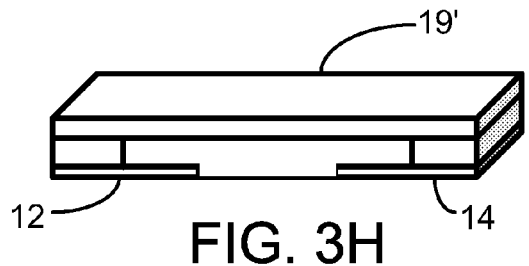
Figure 4:
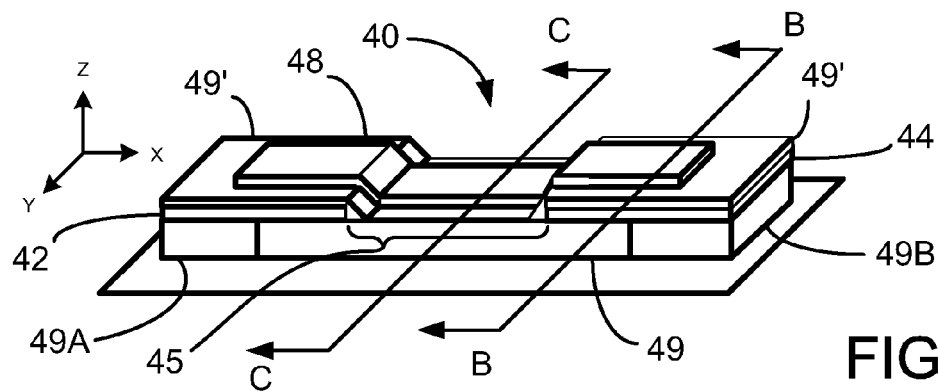
FIG. 4 is a schematic perspective view of a second embodiment of a programmable metallization memory cell according to the present disclosure.
Figure 4A:
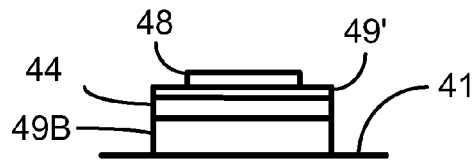
FIG. 4A is an end view of the memory cell of FIG. 4.
Figure 4B:
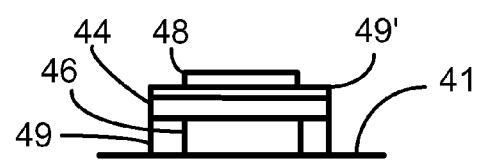
FIG. 4B is a cross-sectional view of the memory cell taken along line B-B of FIG. 4.
Figure 4C:
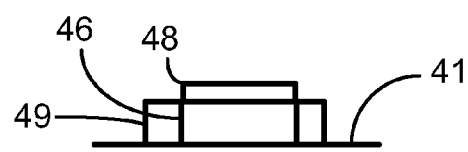
FIG. 4C is a cross-sectional view of the memory cell taken along line C-C of FIG. 4.

The resulting structure (FIG. 3G) has an upper surface (opposite substrate 11 (FIG. 3A)) with exposed dielectric strips 19, fast ion conductor 16, and metal layer 18, and dielectric sections 19A, 19B cover electrodes 12, 14. A dielectric cover 19' can be formed (e.g., back filled) over dielectric strips 19, fast ion conductor 16, and metal layer 18 to insulate and protect the memory cell. The resulting structure is illustrated in FIG. 3H.

A second embodiment of a programmable metallization memory cell according to this disclosure is illustrated in FIGS. 4, 4A, 4B and 4C as memory cell 40. The various elements of memory cell 40 are similar to and have the same or similar properties and features as the corresponding elements of memory cell 10, unless indicated otherwise. In this embodiment, the electrodes are non-overlapping, generally co-planar, but spaced from the support substrate. Memory cell 40 has a substrate 41 with a first electrode 42 and a second electrode 44 positioned on substrate 41 with an intervening layer. Electrodes 42, 44 are positioned on substrate 41 in a non-overlapping manner, in that no portion of one electrode (for example, electrode 42) is positioned between substrate 41 and the other electrode (for example, electrode 44). Electrodes 42, 44 are parallel to substrate 41 and co-planar with each other.

Electrodes 42, 44 are formed of an electrically conducting material, for example, metal. First electrode 42 is an active electrode, made of for example, silver (Ag), copper (Cu), tantalum (Ta) or titanium (Ti). Second electrode 44 is an inert electrode, made of, for example, tungsten (W) or a noble metal such as gold (Au), platinum (Pt), palladium (Pd) and rhodium (Rh). Typically, the material of electrode 42 is different from that of electrode 44.

Electrodes 42, 44 are non-overlapping and spaced from substrate 41 in the Z-direction and from each other in the X-direction by a distance 45. Extending in the Z-direction, no portion of electrode 42 is positioned between substrate 41 and electrode 44, and no portion of electrode 44 is positioned between substrate 41 and electrode 42. Positioned between substrate 41 and electrodes 42, 44 is a layer of fast ion conductor material 46, sandwiched between outer dielectric strips 49.

On substrate 41, fast ion conductor material 46 extends in electrical contact from electrode 42 to electrode 44. Fast ion conductor material 46 may be a base glass material, such as a germanium selenide (GeSe) material, and may be referred to as chalcogenide glass or chalcogenide material. Other chalcogenide or base glass materials, which form superionic clusters when infused with metal ions, could alternately be used. Fast ion conductor material 46 insulates electrodes 42, 44 from substrate 41.

Overlying electrodes 42, 44 is a layer of dielectric material 49'; that is, electrodes 42, 44 are positioned between dielectric layer 49' and fast ion conductor material 46. In the illustrated embodiment, dielectric sections 49A, 49B are present between substrate 41 and electrodes 42, 44, respectively, to support electrodes 42, 44. Dielectric sections 49A, 49B are generally even or level with fast ion conductor material 46.

Positioned proximate fast ion conductor material 46 is an electrochemically active thin metal layer 48, selected based on its ion diffusivity. Metal layer 48 extends from first electrode 42 to second electrode 44, electrically insulated from electrodes 42, 44 by fast ion conductor material 46 and by dielectric layer 49'. Not illustrated in FIG. 4, 4A, 4B or 4C, but shown in FIG. 5, dielectric material 49" insulates metal layer 48 and the other layers.

Fast ion conductor material 46 includes regions or clusters of superionic material that facilitate the transfer of electrons between electrode 42 and electrode 44. Superionic clusters 47 (see FIG. 5) form when metal ions from fast ion conductor material 46 and from metal layer 48 flow toward second electrode 44 from first electrode 42, usually initiated and/or facilitated by irradiating metal layer 48 with UV light with optional heating. Voltage applied on electrodes 42, 44 in write operations will break the connection between superionic clusters 47 or re-establish the connection and change the memory cell between two resistance states.

Figure 5:
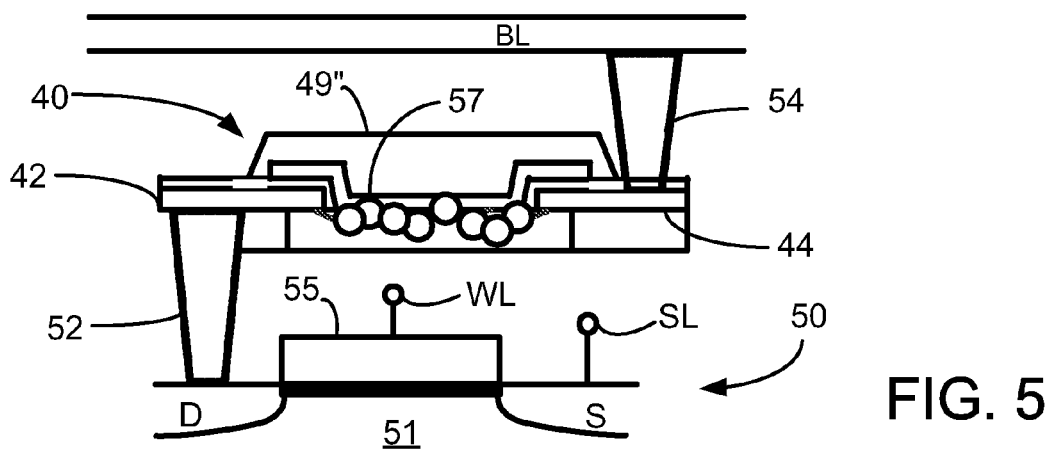
FIG. 5 is a schematic cross-section side view diagram of the memory cell of FIG. 4 operably connected to a control transistor and bit line.

FIG. 5 illustrates memory cell 40 electrically connected to a control transistor 50 at electrode 42 and to a bit line BL at electrode 44. Control transistor 50 and variations thereof are well known. Simplified, transistor 50 includes an insulative substrate 51 having a source region S and a drain region D and a gate 55 therebetween. Electrically connected to source region S is a source line SL and electrically connected to gate 55 is a word line WL. Memory cell 40 is connected to control transistor 50 by a plug 52 extending from electrode 42 and to bit line BL by a plug 54 extending from electrode 44. Transistor 50 and the other elements of FIG. 5 and their connection to memory cell 40 can be formed using conventional semiconductor fabrication techniques.

Figure 6A:
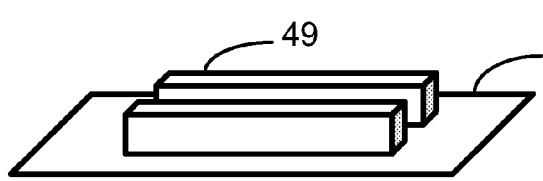
FIGS. 6A-6H are schematic side views of steps for forming the memory cell of FIG. 4.
Figure 6B:
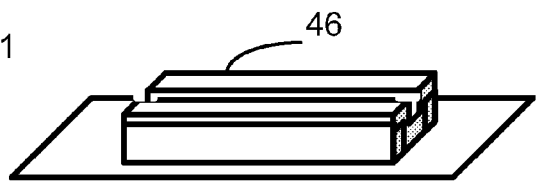

Turning to FIGS. 6A through 6G, one method for manufacturing memory cell 40 is illustrated stepwise. Although this is a suggested process or method to form memory cell 10, any of these steps may be excluded, replaced with alternate steps, or additional steps may be done. In FIG. 6A, dielectric material is applied to substrate 41, for example, by sputtering, physical vapor deposition, photolithography or other thin film processing techniques to form strips of dielectric 49. To obtain the desired shape, a mask or other patterning material can be applied to substrate 41 and then removed after application of In FIG. 6B, fast ion conductor material 46 is deposited over dielectric strips 49 in to fill in the spacing between dielectric strips 49. The structure may optionally be precisely formed to the desired shape and size, by patterning and etching the stacked dielectric strips 49 and fast ion conductor material 46.

Figure 6C:
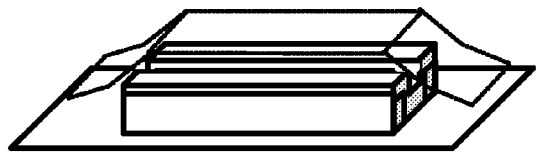
Figure 6D:
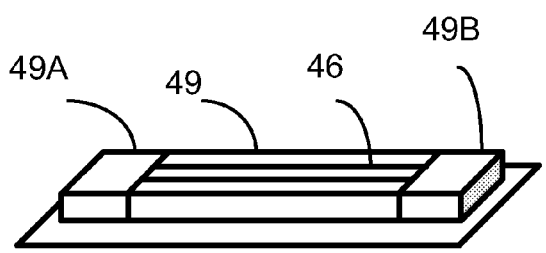
Figure 6E:
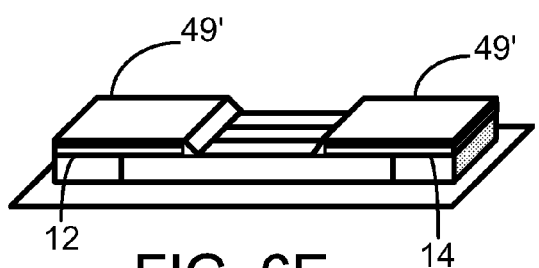

After this, as illustrated in FIG. 6C, the structure can be masked and additional dielectric material deposited over unmasked portions of the structure to cover (e.g., insulate) the structure ends. Alternately, dielectric material can be deposited over the entire structure, and subsequently any undesired dielectric material over dielectric strips 49 and fast ion conductor 46 can be removed (for example, by planarization, milling, polishing). The resulting structure (FIG. 6D) has an upper surface (opposite substrate 41) with exposed dielectric strips 49, fast ion conductor 46 and dielectric sections 49A, 49B.

A first conductive material is applied over dielectric strips 49, fast ion conductor 46 and dielectric section 49A, for example, by sputtering, physical vapor deposition, photolithography or other thin film processing techniques to form electrode 42, and a second conductive material is applied over dielectric strips 49, fast ion conductor 46 and dielectric section 49B to form electrode 44. The application of the conductive materials for electrodes 42, 44 may be done simultaneously, but is usually done sequentially, with no particular preference of order. Then, additional dielectric material is deposited and patterned over electrodes 42, 44 as dielectric layer 49' in FIG. 6E. A central region of fast ion conductor material 46 between electrodes 42, 44 is left exposed.

Figure 6F:
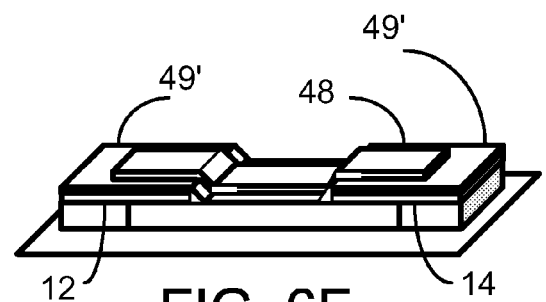

Next, in FIG. 6F, metal layer 48 is deposited on dielectric layer 49' and fast ion conductor material 46, extending from electrode 42 to electrode 44. Metal layer 48 is not in electrical contact with electrodes 42, 44. In this embodiment, metal layer 48 extends beyond the length of fast ion conductor material 46. The amount and thickness of the fast ion conductor material and the metal layer should be well controlled for superionic cluster formation in the next step.

Figure 6G:
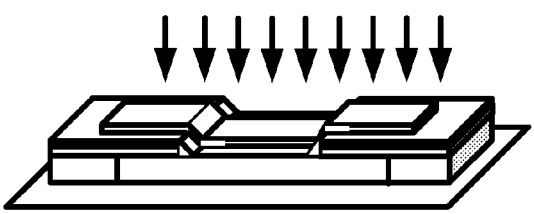
Figure 6H:
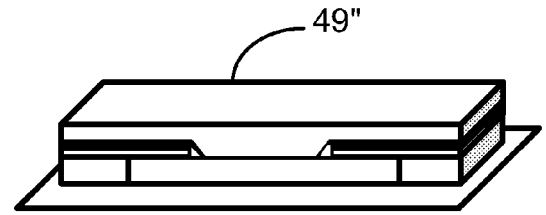

In FIG. 6G, the structure is exposed to UV light radiation or heat treatment to diffuse metal ions from metal layer 48 into fast ion conductor material 46 to form superionic clusters. A dielectric cover 49" can be formed (e.g., back filled) over metal layer 48 and dielectric layer 49' to insulate and protect the memory cell. The resulting structure is illustrated in FIG. 6H.

As described above, to write to any of the PMC memory cells of this disclosure, such as memory cell 10 or memory cell 40, a negative bias is applied to the inert electrode, to create a flow of electrons between the electrodes to link the superionic cluster and form an electrical path from the inert electrode to the active electrode. This electrical path dramatically reduces the resistance between the electrodes.

To read the PMC, a small voltage is applied across the memory cell. If the electrical path formed by superionic clusters is present in that cell, the resistance will be low, leading to higher current, which can be read as a "1". If there is no electrical path formed by superionic clusters, the resistance is higher, leading to low current, which can be read as a "0".

Figure 7:
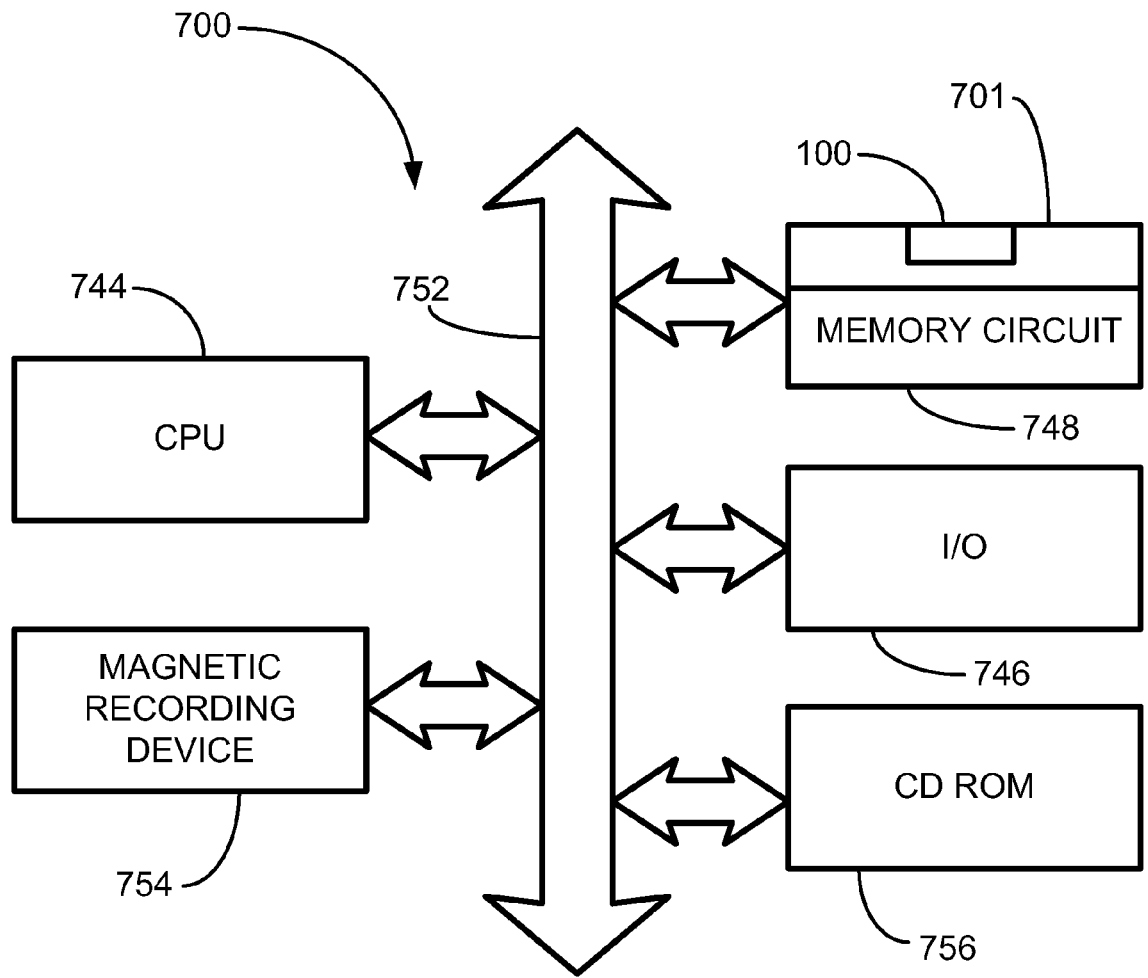
FIG. 7 is a block diagram of a system including a memory cell according to the invention.

FIG. 7 illustrates a processor system 700 which includes a memory circuit 748, e.g., a memory device, which employs memory array 701, which includes at least one memory cell 100 (e.g., memory cell 10 or memory cell 40) according to this disclosure. Processor system 700, which can be, for example, a computer system, generally comprises a central processing unit (CPU) 744, such as a microprocessor, a digital signal processor, or other programmable digital logic devices, which communicates with an input/output (I/O) device 746 over a bus 752. The memory circuit 748 communicates with CPU 744 over bus 752 typically through a memory controller. In the case of a computer system, processor system 700 may include peripheral devices such as a floppy disk drive 754 and a compact disc (CD) ROM drive 756, which communicate with CPU 744 over bus 752. Memory circuit 748 is preferably constructed as an integrated circuit, which includes a memory array 701 having at least one memory cell 100 according to the invention. If desired, memory circuit 748 may be combined with the processor, for example CPU 744, in a single integrated circuit.

Thus, embodiments of the PLANAR PROGRAMMABLE METALLIZATION MEMORY CELLS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A programmable metallization memory cell comprising:
a substrate;
an inert electrode spaced from an active electrode in a non-overlapping manner in relation to the substrate;
a fast ion conductor material in electrical contact with and extending from the inert electrode to the active electrode, the fast ion conductor including superionic clusters extending from the inert electrode to the active electrode; and
a metal layer extending from the inert electrode to the active electrode, yet electrically insulated from each of the inert electrode and the active electrode by the fast ion conductor material.

2. The memory cell of claim 1 wherein the fast ion conductor comprises a germanium selenide material.

3. The memory cell of claim 1 wherein the metal layer comprises silver or copper.

4. The memory cell of claim 1 wherein the active electrode comprises silver, copper, tantalum or titanium.

5. The memory cell of claim 1 wherein the inert electrode comprises tungsten, gold, platinum, palladium or rhodium.

6. The memory cell of claim 1 further comprising a dielectric material extending from the inert electrode to the active electrode proximate the fast ion conductor material.

7. The memory cell of claim 6 wherein the dielectric material electrically insulates the metal layer and the fast ion conductor material.

8. The memory cell of claim 1 further comprising a dielectric material electrically insulating the inert electrode and the active electrode from the metal layer.

9. The memory cell of claim 1 wherein the inert electrode and active electrode are co-planar.

10. A programmable metallization memory cell comprising:
- a substrate;
- an inert electrode on the substrate and spaced from an active electrode on the substrate;
- a fast ion conductor material in electrical contact with and extending from the inert electrode to the active electrode, the fast ion conductor including superionic clusters extending from the inert electrode to the active electrode; and
- a metal layer extending from the inert electrode to the active electrode, yet electrically insulated from each of the inert electrode and the active electrode by the fast ion conductor material.

11. The memory cell of claim 10 wherein the fast ion conductor comprises a germanium selenide material.

12. The memory cell of claim 10 further comprising a dielectric material extending from the inert electrode to the active electrode proximate the fast ion conductor material.

13. The memory cell of claim 12 wherein the dielectric material electrically insulates the metal layer and the fast ion conductor material.

14. The memory cell of claim 10 wherein the inert electrode and active electrode are co-planar.

* * * * *